(12) United States Patent
Kim et al.

(10) Patent No.: US 8,599,635 B2
(45) Date of Patent: Dec. 3, 2013

(54) FUSE CIRCUIT AND SEMICONDUCTOR MEMORY DEVICE INCLUDING THE SAME

(75) Inventors: Jin-Ho Kim, Uiwang-si (KR); Jong-Pil Son, Yongin-si (KR); Seong-Jin Jang, Seongnam-si (KR); Byung-Sik Moon, Seoul (KR); Seung-Hoon Oh, Yongin-si (KR); Ju-Seop Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 262 days.

(21) Appl. No.: 13/205,966

(22) Filed: Aug. 9, 2011

(65) Prior Publication Data

US 2012/0039140 A1 Feb. 16, 2012

(30) Foreign Application Priority Data

Aug. 11, 2010 (KR) .......................... 10-2010-0077102

(51) Int. Cl.
*G11C 17/18* (2006.01)

(52) U.S. Cl.
USPC .......................... 365/225.7; 365/200; 365/201

(58) Field of Classification Search
USPC ....................................... 365/200, 201, 225.7
See application file for complete search history.

(56) References Cited

U.S. PATENT DOCUMENTS 7,211,843 B2 * 5/2007 Low et al. ..................... 257/209

FOREIGN PATENT DOCUMENTS

| JP | 2004-220753 A | 8/2004 |
|---|---|---|
| KR | 10-2001-0008397 A | 2/2001 |
| KR | 10-2005-0058929 A | 6/2005 |
| KR | 10-0812520 B1 | 3/2008 |

* cited by examiner

*Primary Examiner* — Kretelia Graham
(74) *Attorney, Agent, or Firm* — Lee & Morse, P.C.

(57) ABSTRACT

A fuse circuit includes a program unit, a sensing unit and a control unit. The program unit is programmed in response to a program signal, and outputs a program output signal in response to a sensing enable signal. The sensing unit includes a variable resistor unit that has a resistance that varies based on a control signal, and generates a sensing output signal based on the resistance of the variable resistor unit and the program output signal. The control unit generates the control signal having a value changed depending on operation modes, and performs a verification operation with respect to the program unit based on the sensing output signal to generate a verification result. The program unit may be re-programmed based on the verification result.

18 Claims, 14 Drawing Sheets

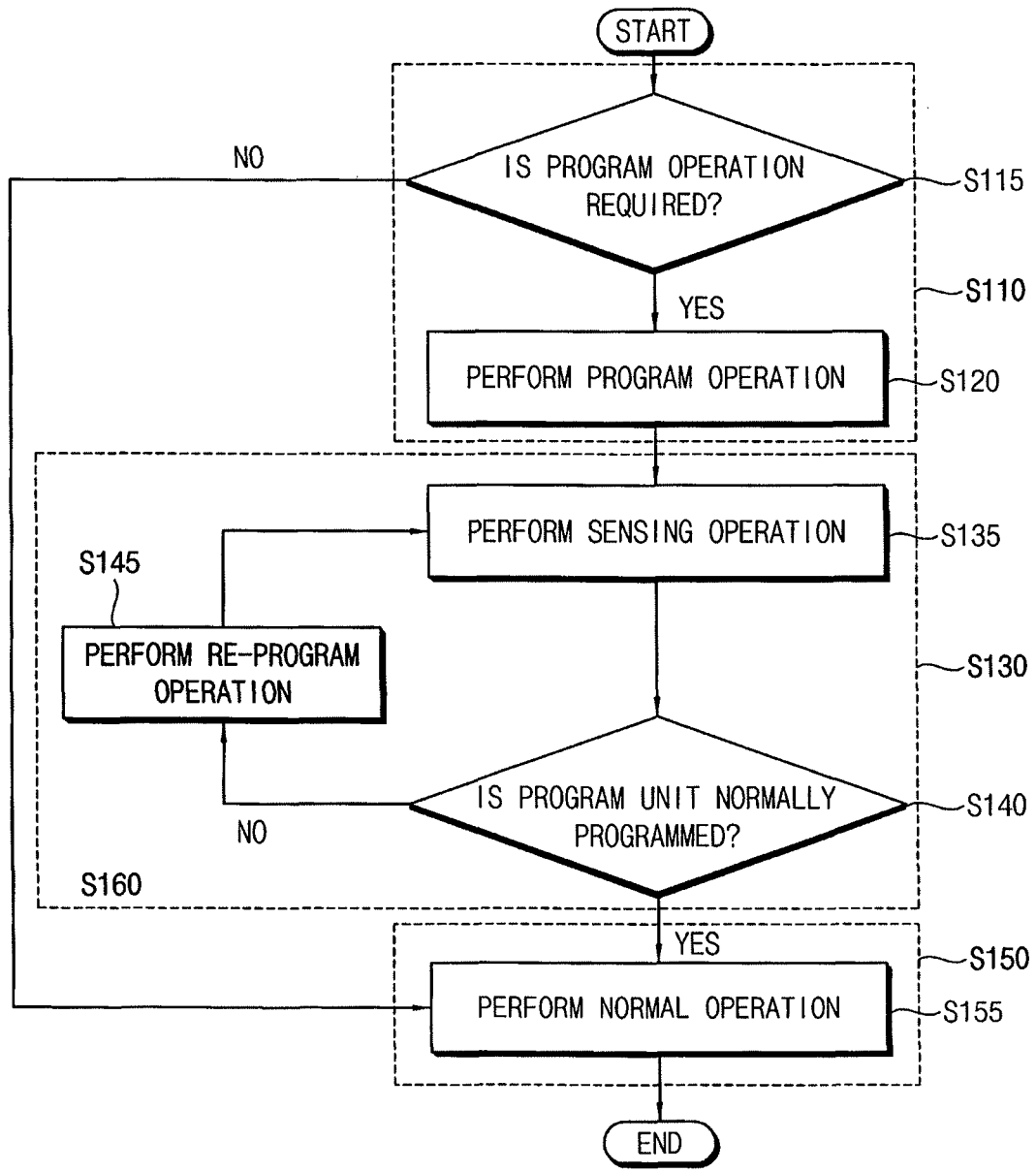

FUSE CIRCUIT AND SEMICONDUCTOR MEMORY DEVICE INCLUDING THE SAME

CROSS-REFERENCE TO RELATED APPLICATION

This application claims priority under 35 USC §119 to Korean Patent Application No. 2010-0077102, filed on Aug. 11, 2010 in the Korean Intellectual Property Office (KIPO), the contents of which are herein incorporated by reference in their entirety.

BACKGROUND

1. Technical Field

Example embodiments relate to an electrical fuse, and more particularly to a fuse circuit and a semiconductor memory device including the fuse circuit.

2. Description of the Related Art

A fuse circuit including at least one fuse is widely used to generate an output signal having different logic levels according to a programmed or unprogrammed state of the fuse. For example, a semiconductor memory device may include redundant memory cells and defective memory cells and a fuse circuit for repairing the defective memory cells. When an address of the defective memory cell is input to the semiconductor memory device, a normal path is cut off and a redundancy path to the redundant memory cell is activated according to a programmed or unprogrammed state of the fuse included in the fuse circuit. Thus, the defective memory cells are replaced with the redundant memory cells based on the operation of the fuse circuit.

SUMMARY

One or more embodiments may provide a fuse circuit having an improved reliability and/or a semiconductor memory device including such a fuse circuit.

One or more embodiments may provide a fuse circuit including a sensing unit that includes a variable resistor unit that has the resistance varied based on the control signal, and the fuse circuit may be configured verify whether or not the program unit is normally programmed and/or may determine whether or not the fuse included in the program unit is a defective fuse based on the sensing output signal that is generated based on the varied resistance of the variable resistor unit. One or more embodiments may provide a fuse circuit having improved reliability and/or configured to effectively control sensing operations.

One or more embodiments may provide a fuse circuit in a semiconductor memory device including a program unit, a sensing unit and a control unit. The program unit is programmed in response to a program signal, and outputs a program output signal in response to a sensing enable signal. The sensing unit includes a variable resistor unit that has a resistance varied based on a control signal, and generates a sensing output signal based on the resistance of the variable resistor unit and the program output signal. The control unit generates the control signal having a value changed depending on operation modes, and performs a verification operation with respect to the program unit based on the sensing output signal to generate a verification result. The program unit may be re-programmed based on the verification result. The operation modes include a first operation mode, a second operation mode and a third operation mode. The fuse circuit performs the program operation in the first operation mode. The fuse circuit verifies the program operation in the second operation mode. The fuse circuit performs a normal operation according to programmed or unprogrammed state of the program unit.

The sensing unit may perform a sensing operation in the second operation mode based on the resistance of the variable resistor unit to generate a sensing result. The control unit may perform the verification operation based on the sensing result in the second operation mode to determine whether or not the program unit is normally programmed.

The sensing unit may determine the resistance of the variable resistor unit based on the control signal, and may determine a logic level of the sensing output signal based on the resistance of the variable resistor unit and the program output signal in the second operation mode. The sensing output signal in the second operation mode may indicate whether or not the program unit is normally programmed.

The control unit may perform the verification operation based on the logic level of the sensing output signal in the second operation mode to determine whether or not the program unit is normally programmed. The program unit may be re-programmed when the program unit is abnormally programmed.

The resistance of the variable resistor unit may be determined as a first resistance in the second operation mode, and as a second resistance in the third operation mode. The second resistance may be larger than the first resistance.

In one or more embodiments, the control unit may further perform a defect determination operation with respect to the program unit based on the sensing output signal to generate a defect determination result. The program unit may be disabled based on the defect determination result.

The sensing unit may perform a sensing operation in the first operation mode based on the resistance of the variable resistor unit to generate a sensing result. The control unit may performs the defect determination operation based on the sensing result in the first operation mode to determine whether or not a fuse included in the program unit is a defective.

The sensing unit may determine the resistance of the variable resistor unit based on the control signal, and may determine a logic level of the sensing output signal based on the resistance of the variable resistor unit and the program output signal in the first operation mode. The sensing output signal in the first operation mode may indicate whether or not the fuse included in the program unit is the defective fuse.

The control unit may perform the defect determination operation based on the logic level of the sensing output signal in the first operation mode to determine whether or not the fuse included in the program unit is the defective fuse. The program unit may be disabled when the fuse included in the program unit is the defective fuse.

The resistance of the variable resistor unit may be determined as a first resistance in the second operation mode, as a second resistance in the third operation mode, and as a third resistance in the first operation mode. The second resistance may be larger than the first resistance, and the third resistance may be larger than the second resistance.

The sensing unit may include the variable resistor unit and a sensing output signal generation unit. The variable resistor unit may have the resistance varied based on the control signal. The sensing output signal generation unit may generate the sensing output signal based on the resistance of the variable resistor unit and the program output signal.

The variable resistor unit may include a plurality of metal oxide semiconductor (MOS) transistors and a switch unit. The MOS transistors may be connected in serial between the sensing output signal generation unit and a ground voltage.

Each of the MOS transistors may have a gate electrode receiving a gate control signal. A voltage level of the gate control signal may be fixed. The switch unit may control electrical connections of the plurality of MOS transistors based on the control signal.

The variable resistor unit may include a MOS transistor. The MOS transistor may be connected between the sensing output signal generation unit and a ground voltage, and may have a gate electrode receiving the control signal.

One or more embodiments may provide a semiconductor memory device including a memory cell array, an address decoder, and a repair circuit. The memory cell array includes normal memory cells and redundant memory cells. The address decoder accesses the normal memory cells or the redundant memory cells in response to an address signal and a sensing output signal. The repair circuit is programmed to indicate the normal memory cell corresponding to the address signal is a defective cell and to output the sensing output signal. The repair circuit includes a plurality of fuse circuits. Each fuse circuit includes a program unit, a sensing unit, and a control unit. The program unit is programmed in response to a program signal and outputs a program output signal in response to a sensing enable signal. The sensing unit includes a variable resistor unit that has a resistance that varies based on a control signal, and generates the sensing output signal based on the resistance of the variable resistor unit and the program output signal. The control unit generates the control signal having a value that changes depending on operation modes and performs a verification operation with respect to the program unit based on the sensing output signal to generate a verification result. The program unit may be re-programmed based on the verification result. The operation modes include a first operation mode, a second operation mode and a third operation mode. The fuse circuit performs the program operation in the first operation mode. The fuse circuit verifies the program operation in the second operation mode. The fuse circuit performs a normal operation according to programmed or unprogrammed state of the program unit.

One or more embodiments may provide a fuse circuit included in a semiconductor memory device and configured to operate in a plurality of operation modes including a first operation mode, a second operation mode, and a third operation mode, the fuse circuit including a program unit including at least one fuse, the program unit being configured to be programmed in response to a program signal and configured to output a program output signal in response to a sensing enable signal, a sensing unit including a variable resistor unit, the variable resistor unit having a resistance that varies based on a control signal, the sensing unit generating a sensing output signal based on the resistance of the variable resistor unit and the program output signal, and a control unit configured to generate the control signal having a value based a current operation mode and configured to perform a verification operation with respect to the program unit based on the sensing output signal to generate a verification result. When the verification result indicates a defect in the programming of the program unit, the program unit is re-programmed.

The sensing output signal may indicate whether the fuse is defective or normal.

When the fuse is determined to be defective, all operations of the fuse circuit may be terminated.

The first operation mode may be a programming mode for programming the program unit, the second operation mode may be a verification mode for verifying the programming of the program unit, and the third operation mode may be a normal operation mode, wherein the normal operation mode is performed only after the program unit is determined to not require programming and/or, if the program unit was programmed, that the programming of the program unit was verified during the second operation mode.

BRIEF DESCRIPTION OF THE DRAWINGS

Features will become more apparent to those of ordinary skill in the art by describing in detail exemplary embodiments with reference to the attached drawings, in which:

FIG. 6 illustrates a flow chart of an exemplary embodiment of an operation of the fuse circuit of FIG. 1;

DETAILED DESCRIPTION

Figure 1:
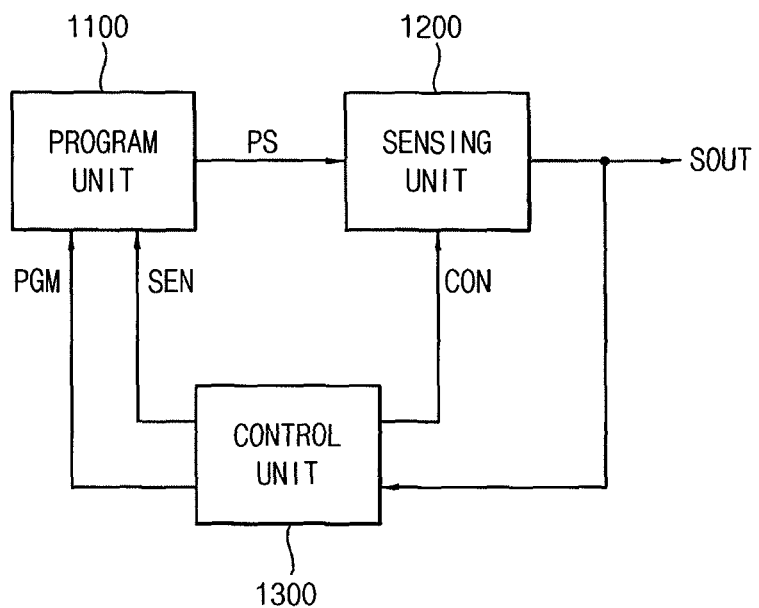
FIG. 1 illustrates a block diagram of an exemplary embodiment of a fuse circuit.

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of an exemplary embodiment of a fuse circuit 1000.

Referring to FIG. 1, the fuse circuit 1000 may include a program unit 1100, a sensing unit 1200, and a control unit 1300.

The fuse circuit 1000 may be included in a semiconductor memory device (not illustrated) that includes normal memory cells and redundant memory cells for replacing defective memory cells among the normal memory cells. The fuse circuit 1000 includes at least one fuse that may be programmed or unprogrammed according to an address of memory cell input to the semiconductor memory device. For example, when the normal memory cells have defects, the fuse may be programmed so that a normal path may be cut off and a redundancy path to the redundant memory cell may be activated.

The fuse circuit 1000 according to some example embodiments may operate alternatively in three modes, that is, a first operation mode, a second operation mode or a third operation mode. The first operation mode may be referred to as a program mode, the second operation mode may be referred to as a sensing mode and the third operation mode may be referred to as a normal mode. The fuse circuit 1000 may perform different operations depending on the operation modes.

For example, in the first operation mode, the fuse circuit 1000 may determine whether or not the program unit 1100 is required to be programmed based on whether or not the normal memory cells have defects. If the program unit 1100 is required to be programmed (i.e., if the normal memory cells have defects), the fuse circuit 1000 may perform a program operation. If the program unit 1100 is not required to be programmed (i.e., if the normal memory cells do not have defects), the fuse circuit 1000 may not perform the program operation. In the first operation mode, the fuse circuit 1000 may further determine whether or not the fuse included in the program unit 1100 is a defective fuse.

In the second operation mode, the fuse circuit 1000 may verify the program operation. If the program unit 1100 is not required to be programmed, the second operation mode may be omitted.

In the third operation mode, the fuse circuit 1000 may perform a normal operation according to a programmed or unprogrammed state of the program unit 1100. When the program unit 1100 is in the unprogrammed state, the fuse circuit 1000 may perform the normal operation by activating a normal path to the normal memory cells. When the program unit 1100 is in the programmed state, the fuse circuit 1000 may perform the normal operation by activating the redundancy path.

Hereinafter, exemplary embodiments of the fuse circuit 1000 and the semiconductor memory device will be described. It may be assumed that the semiconductor memory device includes at least one defective memory cell and is enabled to perform the program operation.

Figure 2:
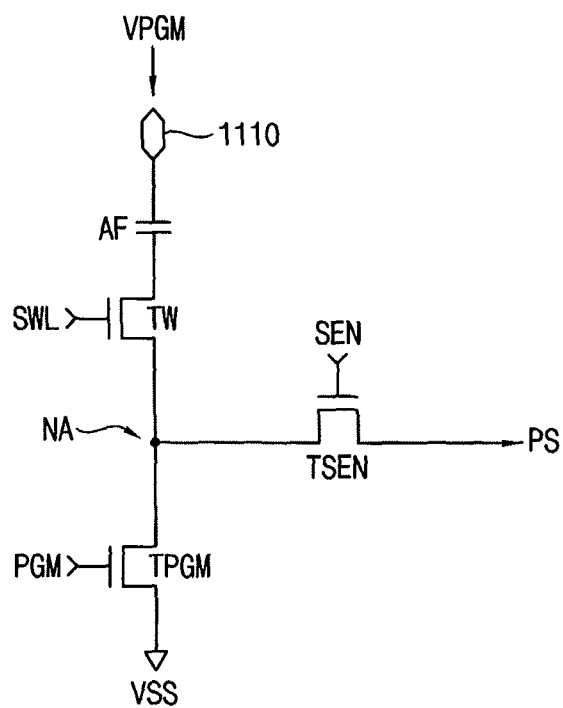
FIG. 2 illustrates a circuit diagram of an exemplary embodiment of the program unit of the fuse circuit of FIG. 1.

The program unit 1100 may be programmed in response to a program signal PGM and may output a program output signal PS in response to a sensing enable signal SEN. The program signal PGM may be activated when the program unit 1100 is required to be programmed. The program unit 1100 may output the program output signal PS when the sensing enable signal SEN is activated. The program unit 1100 may include at least one fuse. For example, the program unit 1100 may include an anti-fuse as illustrated in FIG. 2.

The sensing unit 1200 may include a variable resistor unit that has a resistance varied based on a control signal CON. The sensing unit 1200 may generate a sensing output signal SOUT based on the resistance of the variable resistor unit and the program output signal PS. The control signal CON may include a plurality of control signals. The sensing output signal SOUT may indicate whether or not the program unit 1100 is normally programmed. The sensing output signal SOUT may further indicate whether or not the fuse included in the program unit 1100 is defective. The sensing unit 1200 may be implemented with a latch circuit including an inverter. A logic threshold voltage of the inverter included in the sensing unit 1200 may be used as a reference voltage for a sensing operation of the sensing unit 1200.

The control unit 1300 may generate the program signal PGM, the sensing enable signal SEN, and the control signal CON. A value of the control signal CON may vary in accordance with the operation modes. The control unit 1300 may determine whether or not the program unit 1100 is required to be programmed based on whether or not any of the normal memory cells include defects. The control unit 1300 may receive the sensing output signal SOUT from the sensing unit 1200. The control unit 1300 may perform a verification operation with respect to the program unit 1100 based on the sensing output signal SOUT and may generate a verification result. The program unit 1100 may be re-programmed based on the verification result.

The control unit 1300 may further perform a defect determination operation with respect to the program unit 1100 based on the sensing output signal SOUT and may generate a defect determination result. The program unit 1100 may be disabled based on the defect determination result. The control unit 1300 may control operations of the fuse circuit 1000 based on the operation modes, the verification result and/or the defect determination result.

More particularly, e.g., in one or more embodiments, if the control unit 1300 determines that the program unit 1100 is required to be programmed, in the first operation mode, the program unit 1100 may be programmed in response to the program signal PGM. After the program unit 1100 is programmed, in the second operation mode, the sensing unit 1200 may perform a first sensing operation based on the resistance of the variable resistor unit and may generate a first sensing result. The control unit 1300 may verify whether or not the program unit 1100 is normally programmed based on the first sensing result. When the program unit 1100 is normally programmed, the fuse circuit 1000 may be ready to operate in the third operation mode. In this case, the fuse circuit 1000 may perform the normal operation based on the programmed state of the program unit 1100 in the third operation mode. When the program unit 1100 is abnormally programmed, the program unit 1100 may be re-programmed in the second operation mode.

In the second operation mode, the resistance of the variable resistor unit may be determined as a first resistance. The sensing unit 1200 may determine a logic level of the sensing output signal SOUT based on the resistance of the variable resistor unit (e.g., the first resistance) and the program output signal PS. The sensing output signal SOUT in the second operation mode may indicate whether or not the program unit 1100 is normally programmed. The control unit 1300 may perform the verification operation based on the logic level of the sensing output signal SOUT in the second operation mode to determine whether or not the program unit 1100 is normally programmed. For example, when the sensing output signal SOUT has a first logic level, the control unit 1300 may identify that the program unit 1100 is normally programmed. When the sensing output signal SOUT has a second logic level, the control unit 1300 may identify that the program unit 1100 is abnormally programmed. The first logic level may be a logic low level and the second logic level may be a logic high level.

In the third operation mode, the control unit 1300 may change the value of the control signal CON, and the sensing unit 1200 may vary the resistance of the variable resistor unit based on the changed control signal CON. For example, the resistance of the variable resistor unit may be determined as a second resistance in the third operation mode. The second resistance may be larger than the first resistance. The fuse circuit 1000 may perform the normal operation based on the programmed state of the program unit 1100 and the second resistance of the variable resistor unit.

In one or more embodiments, if the control unit 1300 determines that the program unit 1100 is not required to be programmed, in the first operation mode, the program unit 1100 may not be programmed, i.e., may be unprogrammed. The second operation mode may be omitted and the fuse circuit 1000 may be ready to operate in the third operation mode. The resistance of the variable resistor unit may be determined as the second resistance in the third operation mode. In this case, the fuse circuit 1000 may perform the normal operation based on the unprogrammed state of the program unit 1100 and the second resistance of the variable resistor unit.

The fuse included in the fuse circuit may be programmed based on a voltage signal or a current signal. For example, if the fuse is an anti-fuse, the anti-fuse may be programmed (i.e., electrically shorted) by applying a relatively high voltage to the anti-fuse. The anti-fuse may be embodied by a capacitor and both ends of the capacitor are electrically connected when dielectric material in the capacitor is damaged (i.e., ruptured) by the applied high voltage. However, the anti-fuse may be abnormally and/or incompletely programmed due to an applied relatively low voltage, an insufficient time to apply a program voltage and/or non-uniformity of the dielectric material in the anti-fuse.

In one or more embodiments of the fuse circuit 1000, the control unit 1300 may verify whether or not the program unit 1100 is normally programmed in the second operation mode based on the sensing output signal SOUT, and the program unit 1100 may be re-programmed if the program unit 1100 is abnormally programmed. Thus, one or more embodiments of the fuse circuit 1000 may have an improved reliability relative to comparable fuse circuits.

In an example embodiment, before the control unit 1300 determines whether or not the program unit 1100 is required to be programmed, in the first operation mode, the sensing unit 1200 may perform a second sensing operation based on the resistance of the variable resistor unit to generate a second sensing result. The control unit 1300 may further perform the defect determination operation based on the second sensing result. The defect determination operation may determine whether the fuse is defective.

More particularly, when the fuse included in the program unit 1100 is determined to be a normal fuse, the fuse circuit 1000 may determine whether or not the program unit 1100 is required to be programmed, and may be ready to perform the normal operation according to the programmed or unprogrammed state of the program unit 1100. For example, when the program unit 1100 is in the unprogrammed state, the fuse circuit 1000 may perform the normal operation by activating the normal path. When the program unit 1100 is in the programmed state, the fuse circuit 1000 may perform the normal operation by activating the redundancy path.

When the fuse included in the program unit 1100 is a defective fuse, the program unit 1100 may be disabled. For example, the program unit 1100 may be disabled by masking or screening an output of the program unit 1100.

In the first operation mode, the resistance of the variable resistor unit may be determined as a third resistance. The third resistance may be larger than the second resistance. The sensing unit 1200 may determine the logic level of the sensing output signal SOUT based on the resistance of the variable resistor unit (i.e., the third resistance) and the program output signal PS. The sensing output signal SOUT in the first operation mode may indicate whether or not the fuse included in the program unit 1100 is a defective fuse. The control unit 1300 may perform the defect determination operation based on the logic level of the sensing output signal SOUT in the first operation mode to determine whether or not the fuse included in the program unit 1100 is a defective fuse. For example, when the sensing output signal SOUT has the first logic level, the control unit 1300 may identify that the fuse included in the program unit 1100 is the defective fuse. When the sensing output signal SOUT has the second logic level, the control unit 1300 may identify that the fuse included in the program unit 1100 is the normal fuse.

In some situations, the fuse included in the fuse circuit 1000 may improperly operate due to some defects. For example, if the fuse is the anti-fuse, the anti-fuse may be electrically shorted even before the program operation due to natural damage of the dielectric material in the anti-fuse. In one or more embodiments of the fuse circuit 1000, the control unit 1300 may determine whether or not the fuse included in the program unit 1100 is a defective fuse in the first operation mode based on the sensing output signal SOUT before determining whether or not the program unit 1100 is required to be programmed. In one or more embodiments, if it is determined that the fuse included in the fuse circuit 1000, e.g., the fuse included in the program unit 1100, is defective, the program unit 1100 is disabled. Thus, one or more embodiments of the fuse circuit 1000 may have an improved reliability.

FIG. 2 illustrates a circuit diagram of an exemplary embodiment of the program unit 1100 of the fuse circuit 1000 of FIG. 1.

Referring to FIG. 2, the program unit 1100 may include a program voltage terminal 1110, an anti-fuse AF, a selection transistor TW, a program transistor TPGM and a sensing transistor TSEN.

A program voltage VPGM may be applied to the anti-fuse AF through the program voltage terminal 1110. A first end of the anti-fuse AF may be connected to the program voltage terminal 1110. The selection transistor TW may be connected between a second end of the anti-fuse AF and a first node NA, and may have a gate electrode receiving a wordline signal SWL. The wordline signal SWL may be used as a selection signal for selecting a respective one of the program units 1100 that is to be programmed or sensed. More particularly, e.g., a plurality of the program units 1100 may be arranged in a matrix, e.g., 2100 of FIG. 11, and the wordline signal SWL may be used to select a respective one of the program units 1100 in the array 2100 of FIG. 11.

The program transistor TPGM may be connected between the first node NA and a ground voltage VSS, and may have a gate electrode receiving the program signal PGM. The sensing transistor TSEN may be connected between the first node NA and an output terminal of the program unit 1100, and may have a gate electrode receiving the sensing enable signal SEN. The program unit 1100 may output the program output signal PS through the sensing transistor TSEN in response to the sensing enable signal SEN.

As will be described with reference to FIGS. 5A, 5B and 5C, the program voltage VPGM, the wordline signal SWL, and the program signal PGM may be activated in the first operation mode. A first signal path may be formed from the program voltage terminal 1110, via the first node NA to the ground voltage VSS may be activated, and the program voltage VPGM may be applied to the anti-fuse AF. Under such circumstances, the anti-fuse AF may be programmed.

The program voltage VPGM, the wordline signal SWL and the sensing enable signal SEN may be activated in the second operation mode. A second signal path may be formed from the program voltage terminal 1110, via the first node NA to the output terminal of the program unit 1100. When the second signal path is activated, the program unit 1100 may output the program output signal PS. In one or more embodiments, if the control unit 1300 further performs the defect determination operation in the first operation mode, the second signal path may be activated in the first operation mode.

Figure 3:
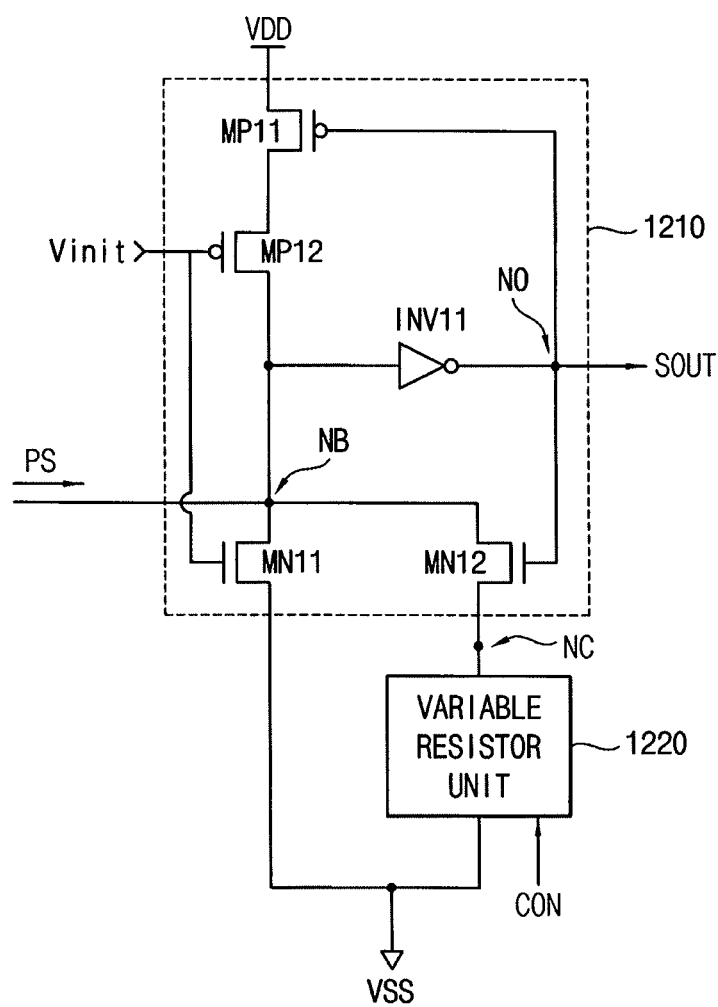
FIG. 3 illustrates a circuit diagram of an exemplary embodiment of the sensing unit of the fuse circuit of FIG. 1.

FIG. 3 illustrates a circuit diagram of an exemplary embodiment of the sensing unit 1200 of the fuse circuit 1000 of FIG. 1.

Referring to FIG. 3, the sensing unit 1200 may include a sensing output signal generation unit 1210 and a variable resistor unit 1220. The sensing unit 1200 may be implemented with a latch circuit including an inverter INV11.

The sensing output signal generation unit 1210 may generate the sensing output signal SOUT based on the resistance of the variable resistor unit 1220 and the program output signal PS. The sensing output signal generation unit 1210 may include a first p-type metal oxide semiconductor (PMOS) transistor MP11, a second PMOS transistor MP12, a first n-type metal oxide semiconductor (NMOS) transistor MN11, a second NMOS transistor MN12 and the inverter INV11.

The inverter INV11 may be connected between a second node NB and an output node NO. The sensing output signal generation unit 1210 may output the sensing output signal SOUT through the output node NO. The first and second PMOS transistors MP11 and MP12 may be connected in series between a power supply voltage VDD and the second node NB. The first PMOS transistor MP11 may have a gate electrode connected to the output node NO. The second PMOS transistor MP12 may have a gate electrode receiving an initialization signal Vinit. The first NMOS transistor MN11 may be connected between the second node NB and the ground voltage VSS, and may have a gate electrode receiving the initialization signal Vinit. The second NMOS transistor MN12 may be connected between the second node NB and the variable resistor unit 1220 (i.e., a third node NC), and may have a gate electrode connected to the output node NO.

The variable resistor unit 1220 may be connected between the third node NC and the ground voltage VSS. The resistance of the variable resistor unit 1220 may be varied based on the control signal CON. The variable resistor unit 1220 may include a plurality of resistors, at least one active resistor, etc.

As will be described with reference to FIGS. 5B and 5C, the initialization signal Vinit may be activated in the second operation mode. A third signal path may be formed from the second node NB, via the second NMOS transistor MN12 and the variable resistor unit 1220, to the ground voltage VSS and may be activated. The second signal path in the program unit 1100 of FIG. 2 and the third signal path in the sensing unit 1200 may form a single signal path, and the program output signal PS may be provided to the variable resistor unit 1220 through the second and third signal paths. A voltage level at the second node NB may be determined based on resistances of the second and third signal paths. For example, the voltage level at the second node NB may be determined based on a resistance of the anti-fuse AF in the program unit 1100 of FIG. 2 and the resistance of the variable resistor unit 1220. The sensing output signal generation unit 1210 may generate the sensing output signal SOUT based on the voltage level at the second node NB and a logic threshold voltage of the inverter INV11. In an example embodiment, if the control unit 1300 further performs the defect determination operation in the first operation mode, the third signal path may be activated in the first operation mode.

In a conventional fuse circuit including a sensing unit that is implemented with a voltage comparator, the sensing unit performs a sensing operation based on a reference voltage and the conventional fuse circuit requires an additional circuit such as a voltage generator for providing the reference voltage to the sensing unit. The voltage generator included in the conventional fuse circuit has a relatively more complex structure in order to vary a level of the reference voltage to control the sensing operation. In a conventional fuse circuit including a sensing unit that is implemented with a latch circuit having an inverter, the sensing unit performs a sensing operation based on a logic threshold voltage of the inverter included in the sensing unit. The logic threshold voltage of the inverter is used as a reference voltage, but has a fixed level. Thus, in the conventional fuse circuits, it is difficult to control the sensing operation of the sensing unit.

In one or more embodiments of the fuse circuit 1000, the sensing unit 1200 includes the variable resistor unit that has a varied resistance based on the control signal CON. More particularly, e.g., in one or more embodiments, a voltage level at the second node NB in the sensing unit 1200 may be controlled by varying the resistance of the variable resistor unit 1220 based on the control signal CON. Thus, the fuse circuit 1000 may effectively control the sensing operations of the sensing unit 1200 and may perform relatively stable sensing operations.

FIGS. 4A, 4B, 4C, and 4D illustrate circuit diagrams of exemplary embodiments of the variable resistor unit of the sensing unit of FIG. 3.

Figure 4A:
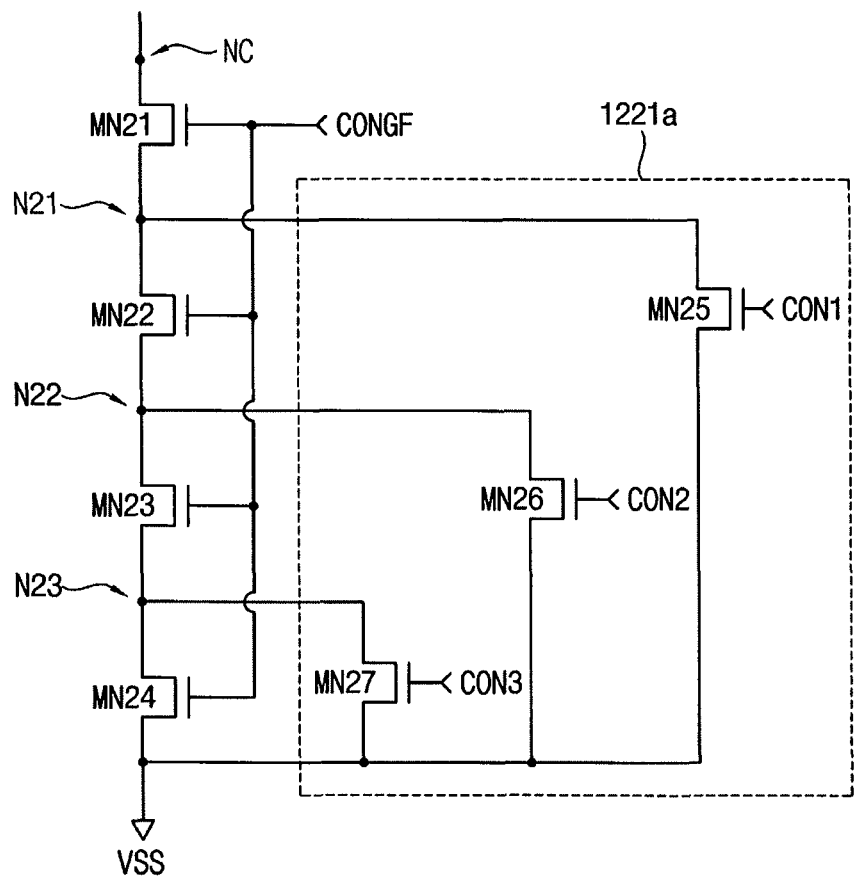
FIGS. 4A, 4B, 4C and 4D illustrate circuit diagrams of exemplary embodiments of the variable resistor unit of the sensing unit of FIG. 3.

Referring to FIG. 4A, a variable resistor unit 1220a may include a plurality of NMOS transistors MN21, MN22, MN23 and MN24 and a switch unit 1221a.

The plurality of NMOS transistors MN21, MN22, MN23 and MN24 may be connected in series between the sensing output signal generation unit 1210 (i.e., the third node NC) and the ground voltage VSS. For example, the NMOS transistor MN21 may be connected between the third node NC and a fourth node N21, the NMOS transistor MN22 may be connected between the fourth node N21 and a fifth node N22, the NMOS transistor MN23 may be connected between the fifth node N22 and a sixth node N23, and the NMOS transistor MN24 may be connected between the sixth node N23 and the ground voltage VSS. Each of the NMOS transistors MN21, MN22, MN23 and MN24 may have a gate electrode receiving a gate control signal CONGF. A voltage level of the gate control signal CONGF may be fixed, and thus, each of the NMOS transistors MN21, MN22, MN23 and MN24 may operate as a resistor having fixed resistance.

The switch unit 1221a may control electrical connections of the plurality of NMOS transistors MN21, MN22, MN23, and MN24 based on the control signal. The control signal may include a plurality of control signals CON1, CON2, and CON3.

The switch unit 1221a may include a plurality of NMOS transistors MN25, MN26, and MN27. The NMOS transistors MN25, MN26, and MN27 may be referred to as switching transistors. The first switching transistor MN25 may be connected between the fourth node N21 and the ground voltage VSS, and may have a gate electrode receiving a first control signal CON1. The second switching transistor MN26 may be connected between the fifth node N22 and the ground voltage VSS, and may have a gate electrode receiving a second control signal CON2. The third switching transistor MN27 may be connected between the sixth node N23 and the ground voltage VSS, and may have a gate electrode receiving a third control signal CON3. The NMOS transistors MN25, MN26, and MN27 may have smaller resistances than resistances of the NMOS transistors MN21, MN22, MN23 and MN24.

One of the control signals CON1, CON2, and CON3 may be activated or all of the control signals CON1, CON2, and CON3 may be deactivated depending on the operation mode. At least one of the NMOS transistors MN21, MN22, MN23, and MN24 may be electrically connected between the third node NC and the ground voltage VSS based on the control signals CON1, CON2, and CON3, and thus the resistance of the variable resistor unit 1220a may be determined. For example, when the first control signal CON1 is activated, the NMOS transistor MN21 may be electrically connected between the third node NC and the ground voltage VSS. In this case, the resistance of the variable resistor unit 1220a may correspond to a resistance of the NMOS transistor MN21. When the second control signal CON2 is activated, the NMOS transistors MN21 and MN22 may be electrically connected between the third node NC and the ground voltage VSS. In this case, the resistance of the variable resistor unit 1220a may correspond to a sum of resistances of the NMOS transistors MN21 and MN22.

Although the variable resistor unit 1220a is illustrated in FIG. 4A as including seven NMOS transistors MN21, MN22, MN23, MN24, MN25, MN26, and MN27, embodiments are not limited thereto. For example, the number of the NMOS transistors included in the variable resistor unit 1220a may be greater than or less than seven.

Figure 4B:
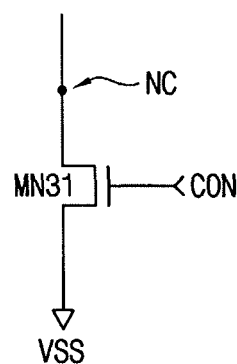

Referring to FIG. 4B, a variable resistor unit 1220b may include a NMOS transistor MN31.

The NMOS transistor MN31 may be connected between the sensing output signal generation unit 1210 (i.e., the third node NC) and the ground voltage VSS and may have a gate electrode receiving the control signal CON. The NMOS transistor MN31 may operate as an active resistor. For example, the NMOS transistor MN31 may have a resistance that varies in response to a level of the control signal CON. The resistance of the variable resistor unit 1220b may correspond to the resistance of the NMOS transistor MN31.

Figure 4C:
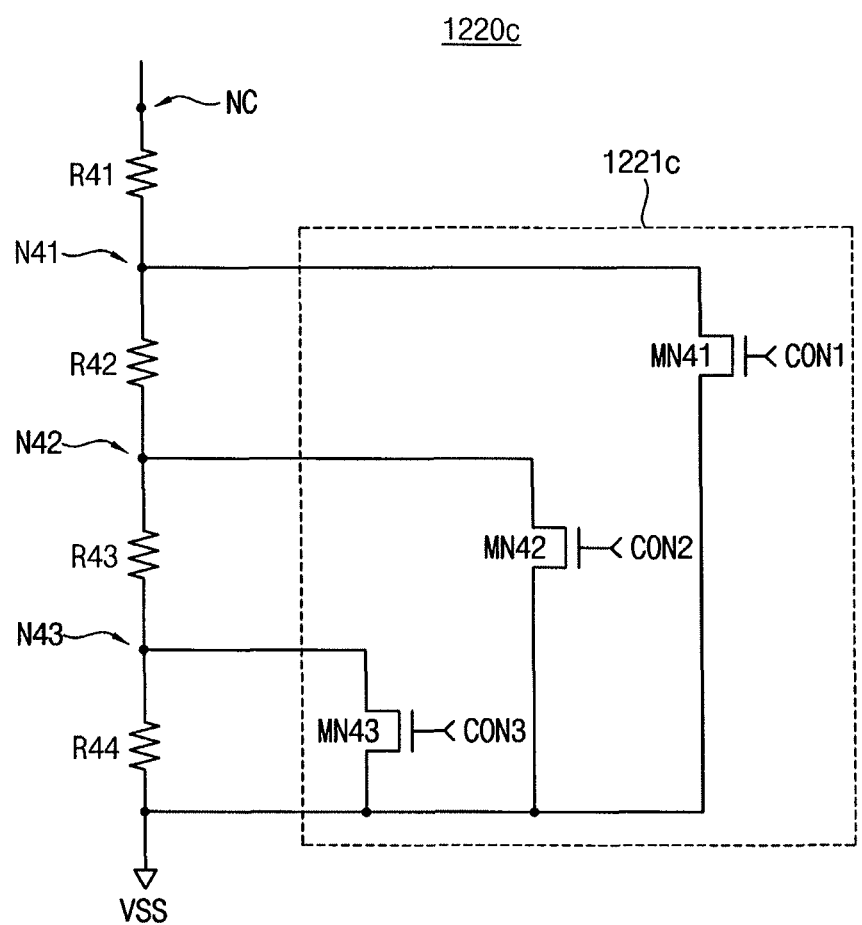

Referring to FIG. 4C, a variable resistor unit 1220c may include a plurality of resistors R41, R42, R43, and R44 and a switch unit 1221c.

The plurality of resistors R41, R42, R43, and R44 may be connected in series between the sensing output signal generation unit 1210 (i.e., the third node NC) and the ground voltage VSS. For example, the resistor R41 may be connected between the third node NC and a fourth node N41, the resistor R42 may be connected between the fourth node N41 and a fifth node N42, the resistor R43 may be connected between the fifth node N42 and a sixth node N43, and the resistor R44 may be connected between the sixth node N43 and the ground voltage VSS.

The switch unit 1221c may control electrical connections of the plurality of resistors R41, R42, R43, and R44 based on the control signals CON1, CON2, and CON3. The switch unit 1221c may include a plurality of switching transistors MN41, MN42, and MN43. The first switching transistor MN41 may be connected between the fourth node N41 and the ground voltage VSS, and may have a gate electrode receiving a first control signal CON1. The second switching transistor MN42 may be connected between the fifth node N42 and the ground voltage VSS, and may have a gate electrode receiving a second control signal CON2. The third switching transistor MN43 may be connected between the sixth node N43 and the ground voltage VSS, and may have a gate electrode receiving a third control signal CON3.

One or more of the control signals CON1, CON2, and CON3 may be activated or all of the control signals CON1, CON2, and CON3 may be deactivated depending on the operation modes. At least one of the resistors R41, R42, R43, and R44 may be electrically connected between the third node NC and the ground voltage VSS based on the control signals CON1, CON2, and CON3, and a resistance of the variable resistor unit 1220c may be determined based on the electrical connection of the resistors R41, R42, R43, and R44. For example, when the first control signal CON1 is activated, the resistor R41 may be electrically connected between the third node NC and the ground voltage VSS. In this case, the resistance of the variable resistor unit 1220c may correspond to a resistance of the resistor R41.

Although the variable resistor unit 1220c in FIG. 4C is illustrated as including four resistors R41, R42, R43, and R44 and three NMOS transistors MN41, MN42, and MN43, embodiments are not limited thereto. For example, a number of the resistors and/or a number of the NMOS transistors included in the variable resistor unit 1220c may be greater than or less than that illustrated in FIG. 4C.

Figure 4D:
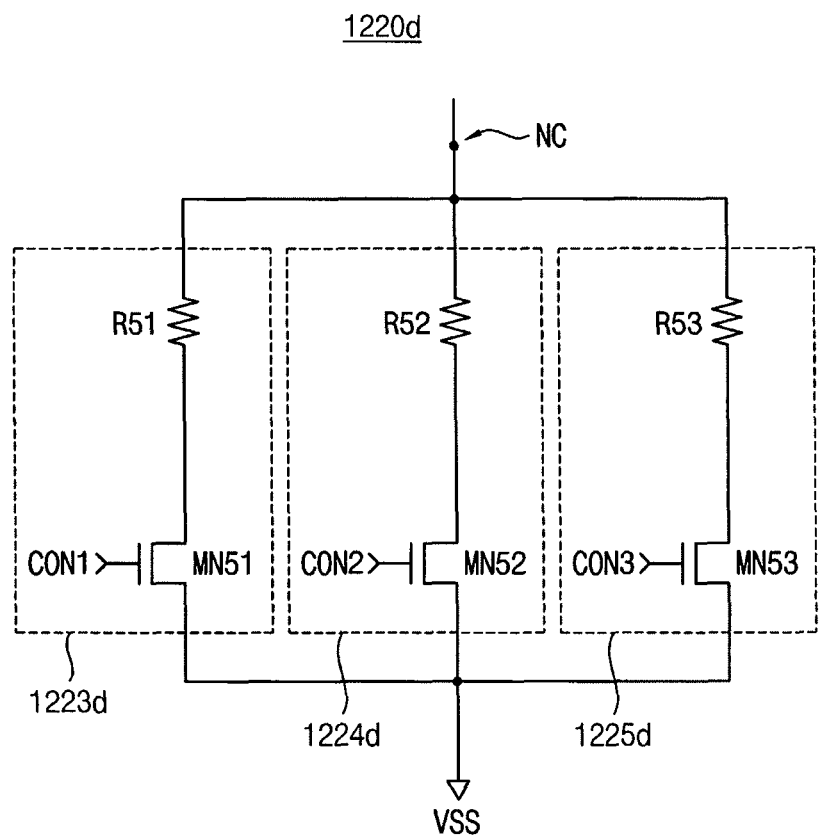

Referring to FIG. 4D, a variable resistor unit 1220d may include a plurality of resistor blocks 1223d, 1224d, and 1225d.

The plurality of resistor blocks 1223d, 1224d, and 1225d may be connected in parallel between the sensing output signal generation unit 1210 (i.e., the third node NC) and the ground voltage VSS. Each of the resistor blocks 1223d, 1224d, and 1225d may include a respective one of a plurality of resistors R51, R52, and R53 and a respective one of a plurality of NMOS transistors MN51, MN52 and MN53. Each of the resistors R51, R52, and R53 may be connected to the third node NC. Each of the NMOS transistors MN51, MN52, and MN53 may be connected between the respective one of the plurality of resistors R51, R52, and R53 and the ground voltage VSS, and may have a gate electrode receiving a respective one of the control signals CON1, CON2, and CON3. For example, a first resistor block 1223d may include a first resistor R51 connected to the third node NC, and a first NMOS transistor MN51 that is connected between the first resistor R51 and the ground voltage VSS and has a gate electrode receiving the first control signal CON1.

At least one of the control signals CON1, CON2, and CON3 may be activated depending on the operation modes. At least one of the resistor blocks 1223d, 1224d, and 1225d may be electrically connected between the third node NC and the ground voltage VSS based on the control signals CON1, CON2, and CON3, and thus the resistance of the variable resistor unit 1220d may be determined. For example, when the first control signal CON1 is activated, the first resistor R51 may be electrically connected between the third node NC and the ground voltage VSS. In this case, the resistance of the variable resistor unit 1220d may correspond to a resistance of the first resistor R51.

Although the variable resistor unit 1220d including three resistor blocks 1223d, 1224d, and 1225d is illustrated in FIG. 4D for convenience of illustration, the number of the resistor blocks included in the variable resistor unit 1220d is not limited thereto.

As described above with reference to FIGS. 4A, 4B, 4C, and 4D, the variable resistor units 1220a, 1220b, 1220c, and 1220d may include at least one transistor. As manufacturing processes are developed, transistors included in the variable resistor units 1220a, 1220b, 1220c, and 1220d and transistors included in the other parts of the fuse circuit 1000 may have a relatively small size, and thus, the fuse circuit 1000 may have an improved integration degree. In addition, the transistors included in the variable resistor units 1220a, 1220b, 1220c, and 1220d and the inverter INV11 included in the sensing output signal generation unit 1210 may be simultaneously affected by changes of temperature, voltage (e.g., a power supply voltage) and manufacturing process. The control signals CON1, CON2, and CON3 may be generated based on internal voltage signals used in the semiconductor memory device. Thus, the sensing unit 1200 may perform relatively stable sensing operations although external operation conditions are changed.

Figure 5A:
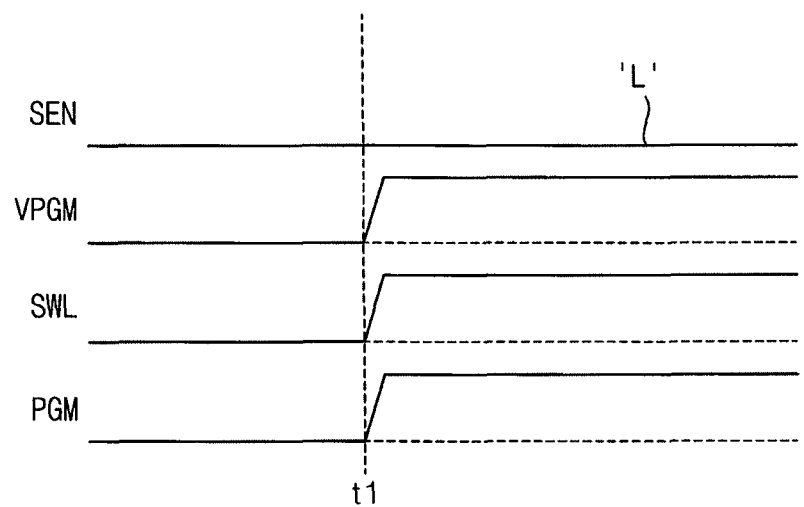
FIGS. 5A, 5B and 5C illustrate timing diagrams of exemplary signals employable for an exemplary operation of the fuse circuit of FIG. 1.
Figure 5B:
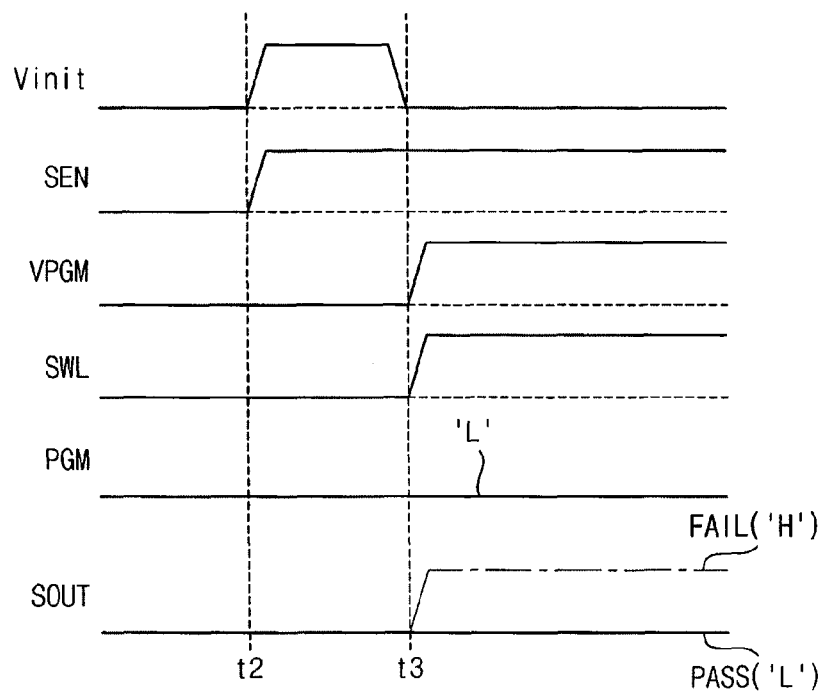
Figure 5C:
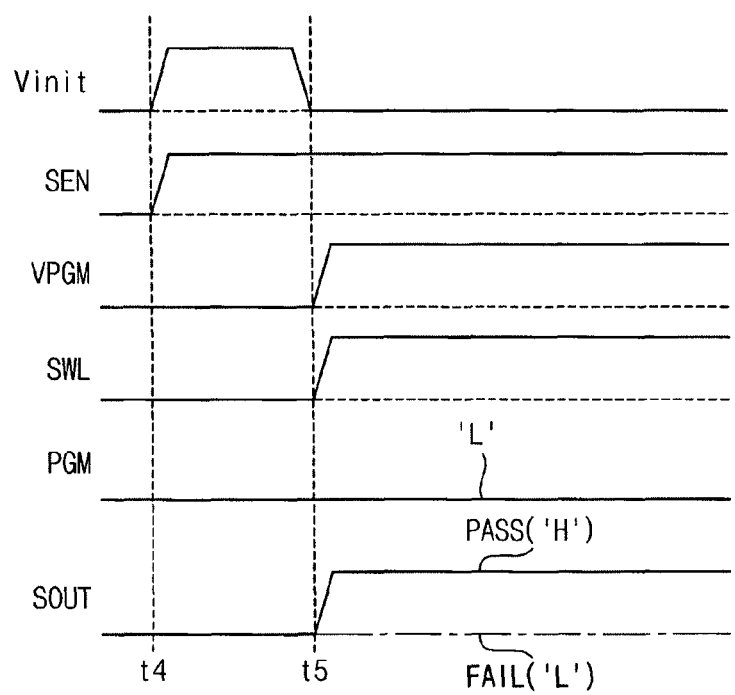

FIGS. 5A, 5B, and 5C illustrate timing diagrams of exemplary signals employable for an exemplary operation of the fuse circuit of FIG. 1. More particularly, FIG. 5A illustrates an exemplary program operation of the fuse circuit 1000 of FIG. 1 in the first operation mode. FIG. 5B illustrates an exemplary verification operation of the fuse circuit 1000 of FIG. 1 in the second operation mode. FIG. 5C illustrates an exemplary defect determination operation of the fuse circuit 1000 of FIG. 1 in the first operation mode.

Hereinafter, the exemplary program operation of the fuse circuit 1000 in the first operation mode is described with reference to FIGS. 1, 2, and 5A.

At time t1, when the program unit 1100 is required to be programmed, the program signal PGM, the program voltage VPGM and the wordline signal SWL are activated, respectively. The program voltage VPGM may have a level of about 5V to about 7V. The selection transistor TW is turned on in response to the wordline signal SWL, the program transistor TPGM is turned on in response to the program signal PGM, and thus, the first signal path is activated. The program voltage VPGM may be applied to the anti-fuse AF, and the anti-fuse AF may be programmed after the program voltage VPGM is applied to the anti-fuse AF for a predetermined period of time. The sensing enable signal SEN is deactivated during the program operation.

If the anti-fuse AF is a normal fuse, the anti-fuse AF may have a resistance of about few hundreds k$\Omega$ to about few M$\Omega$ before the anti-fuse AF is programmed. If the anti-fuse is normally programmed, the anti-fuse AF may have the resistance of about 1 k$\Omega$ after the anti-fuse AF is programmed.

Hereinafter, the exemplary verification operation of the fuse circuit 1000 in the second operation mode is described with reference to FIGS. 1, 2, 3, and 5B.

At time t2, after the anti-fuse AF is programmed, the sensing enable signal SEN and the initialization signal Vinit are activated, respectively. The fuse circuit 1000 operates in the second operation mode. The sensing transistor TSEN is turned on in response to the sensing enable signal SEN. The first NMOS transistor MN11 is turned on in response to the initialization signal Vinit and, thus, the second node NB is initialized.

At time t3, the program voltage VPGM and the wordline signal SWL are activated, respectively. In this case, the program voltage VPGM may have lower level than the level of the program voltage VPGM during the program operation. The selection transistor TW is turned on in response to the wordline signal SWL, the second signal path is activated and, thus, the program unit 1100 may output the program output signal PS. In addition, the initialization signal Vinit is deactivated at time t3. The first NMOS transistor MN11 is turned off, the second PMOS transistor MP12 is turned on, and thus, the third signal path may be activated. The program output signal PS may be provided to the variable resistor unit 1220 through the third signal path. A voltage level at the second node NB may be determined based on the resistance of the anti-fuse AF and the resistance of the variable resistor unit 1220. The sensing output signal generation unit 1210 may generate the sensing output signal SOUT based on the voltage level of the second node NB. The program signal PGM may be deactivated during the verification operation.

In one or more embodiments, the sensing output signal SOUT in the second operation mode may indicate whether or not the program unit 1100 is normally programmed. The resistance of the variable resistor unit 1220 may be determined as the first resistance in the second operation mode. The sensing unit 1200 may determine the voltage level at the second node NB based on the first resistance and the resistance of the anti-fuse AF, and may determine the logic level of the sensing output signal SOUT based on the voltage level at the second node NB. The first resistance may be larger than or equal to the resistance of the anti-fuse AF after being programmed. For example, the first resistance may be about 10 k$\Omega$.

When the anti-fuse AF is normally programmed, the logic level of the sensing output signal SOUT may be the first logic level ('L'). The fuse circuit 1000 may be ready to operate in the third operation mode. The control unit 1300 changes the value of the control signal CON based on the sensing output signal SOUT having the first logic level in the third operation mode. The resistance of the variable resistor unit 1220 is determined as the second resistance based on the changed control signal CON. The second resistance may be larger than the first resistance. For example, the second resistance may be about 50 k$\Omega$. The fuse circuit 1000 may then perform the normal operation in third operation mode.

When the anti-fuse AF is abnormally programmed, the logic level of the sensing output signal SOUT may be the second logic level ('H'). The program signal PGM is activated based on the sensing output signal SOUT having the second logic level. The program unit 1100 may then be re-programmed.

Hereinafter, the exemplary defect determination operation of the fuse circuit 1000 in the first operation mode is described with reference to FIGS. 1, 2, 3 and 5C.

At time t4, before the control unit 1300 determines whether or not the anti-fuse AF is required to be programmed, the sensing enable signal SEN and the initialization signal Vinit are activated, respectively. The sensing transistor TSEN may be turned on in response to the sensing enable signal SEN. The first NMOS transistor MN11 may be turned on in response to the initialization signal Vinit, and thus, the second node NB may be initialized.

At time t5, the program voltage VPGM and the wordline signal SWL may be activated, respectively. During the defect determination operation, the program voltage VPGM may have a lower level than the level of the program voltage VPGM during the program operation. In response to the wordline signal SWL, the selection transistor TW is turned on, the second signal path is activated, and, thus, the program unit 1100 may output the program output signal PS. In addition, the initialization signal Vinit may be deactivated at time t5. Referring to FIG. 5C, the first NMOS transistor MN11 is turned off, the second PMOS transistor MP12 is turned on, and, thus, the third signal path is activated. The program output signal PS may be provided to the variable resistor unit 1220 through the third signal path. The voltage level at the second node NB may be determined based on the resistance of the anti-fuse AF and the resistance of the variable resistor unit 1220. The sensing output signal generation unit 1210 may generate the sensing output signal SOUT based on the voltage level of the second node NB. The program signal PGM is deactivated during the defect determination operation.

In one or more embodiments, the sensing output signal SOUT in the first operation mode may indicate whether or not the anti-fuse AF is the defective fuse. The resistance of the variable resistor unit 1220 is determined as the third resistance in the first operation mode. The sensing unit 1200 determines the voltage level at the second node NB based on the third resistance and the resistance of the anti-fuse AF, and determines the logic level of the sensing output signal SOUT based on the voltage level at the second node NB. The third resistance may be smaller than or equal to the resistance of the anti-fuse AF before being programmed. For example, the third resistance may be about 400 kΩ.

Referring to FIG. 5C, when the anti-fuse AF is the normal fuse, the logic level of the sensing output signal SOUT may be the second logic level ('H'). The fuse circuit 1000 may be ready to perform the normal operation according to the programmed or unprogrammed state of the anti-fuse AF.

When the anti-fuse AF is the defective fuse, the logic level of the sensing output signal SOUT may be the first logic level ('L'). The program unit 1100 is disabled by masking or screening the output of the program unit 1100.

Figure 7:
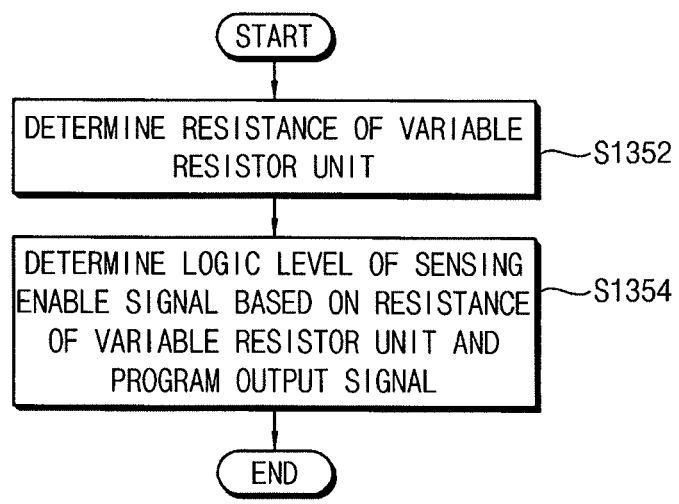
FIG. 7 illustrates a flow chart of an exemplary embodiment of a sensing operation of FIG. 6.

FIG. 6 illustrates a flow chart of an exemplary embodiment of an operation of the fuse circuit of FIG. 1. FIG. 7 illustrates a flow chart of an exemplary embodiment of a sensing operation of FIG. 6.

Hereinafter, exemplary operations of the fuse circuit 1000 will be described with reference to FIGS. 1, 3, 6 and 7.

Referring to FIG. 6, the fuse circuit 1000 of FIG. 1 may operate in a first operation mode (S110), a second operation mode (S130) and/or a third operation mode (S150).

In the first operation mode, the fuse circuit 1000 may determine whether or not a program operation is required (S115). For example, the control unit 1300 may determine whether or not the program unit 1100 is required to be programmed based on whether or not normal memory cells included in a semiconductor memory device have defects.

If the program operation is not required, the program unit 1100 is unprogrammed, the second operation mode may be omitted and the fuse circuit 1000 is ready to operate in the third operation mode. The fuse circuit 1000 may then perform a normal operation in the third operation mode (S155). For example, the fuse circuit 1000 may perform the normal operation by activating a normal path in the semiconductor memory device according to unprogrammed state of the program unit 1100.

If the program operation is required, the fuse circuit 1000 may perform the program operation (S120). For example, the program signal PGM may be activated and the program unit 1100 may be programmed in response to the program signal PGM.

After the fuse circuit 1000 performs the program operation, in the second operation mode, the fuse circuit 1000 may verify the program operation. The fuse circuit 1000 may perform a sensing operation based on a resistance of the variable resistor unit 1220 and the program output signal PS to generate a sensing result (step S135). The resistance of the variable resistor unit 1220 may be varied based on the control signal CON. The program output signal PS may be output from the program unit 1100 when the sensing enable signal SEN is activated.

Referring to FIG. 7, during S135, the resistance of the variable resistor unit 1220 may be determined based on the control signal CON (S1352). For example, the resistance of the variable resistor unit 1220 may be determined as a first resistance in the second operation mode. The first resistance may be larger than or equal to the resistance of the program unit 1100 after the program unit 1100 is programmed. For example, the first resistance may be equal to and/or about 10 kΩ. A logic level of the sensing output signal SOUT may be determined based on the resistance of the variable resistor unit 1220 (i.e., the first resistance) and the program output signal PS (S1354). The sensing output signal SOUT in the second operation mode may indicate whether or not the program unit 1100 is normally programmed.

Referring back to FIG. 6, in the second operation mode, the fuse circuit 1000 may determine whether or not a re-program operation is required based on the sensing result (S140). For example, the control unit 1300 may verify whether or not the program unit 1100 is normally programmed based on the sensing output signal SOUT. When the sensing output signal SOUT has a first logic level (e.g., a logic low level), the control unit 1300 may identify that the program unit 1100 is normally programmed and the re-program operation is not required. When the sensing output signal SOUT has a second logic level (e.g., a logic high level), the control unit 1300 may identify that the program unit 1100 is abnormally programmed and the re-program operation is required.

If the re-program operation is required, the fuse circuit 1000 performs the re-program operation (S145). For example, the program signal PGM may be activated, and the program unit 1100 may be re-programmed in response to the program signal PGM. The fuse circuit 1000 may repeat the steps S135 and S140 to verify the re-program operation.

If the re-program operation is not required, the fuse circuit 1000 is ready to operate in the third operation mode. The fuse circuit 1000 may perform the normal operation in the third operation mode (S155). For example, the resistance of the variable resistor unit 1220 may be determined as a second resistance in the third operation mode. The second resistance may be larger than the first resistance. For example, the second resistance may be equal to and/or about 50 kΩ. The fuse circuit 1000 may perform the normal operation by activating a redundancy path in the semiconductor memory device according to programmed state of the program unit 1100.

Figure 8:
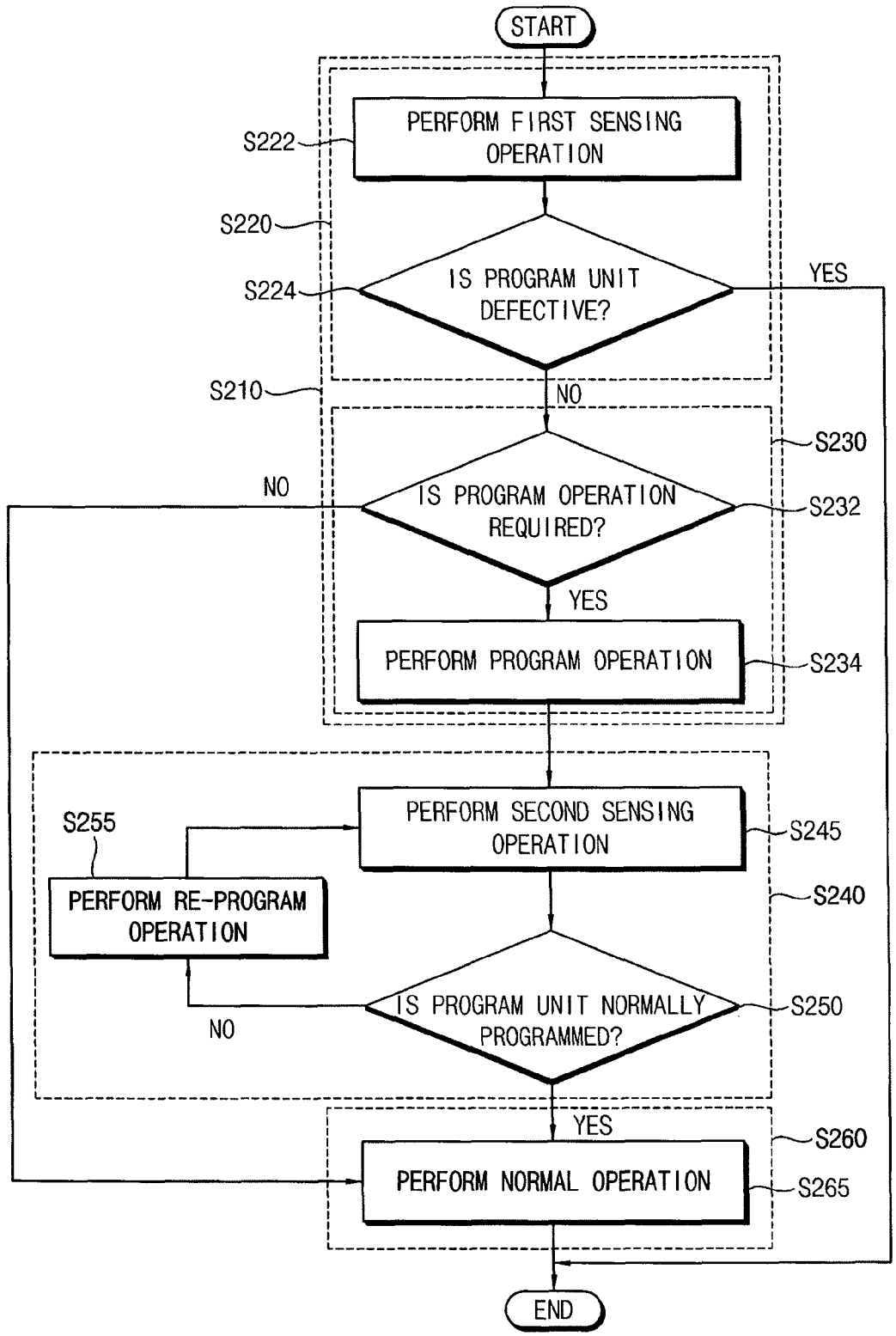
FIG. 8 illustrates a flow chart of another exemplary embodiment of an operation of the fuse circuit of FIG. 1.
Figure 9:
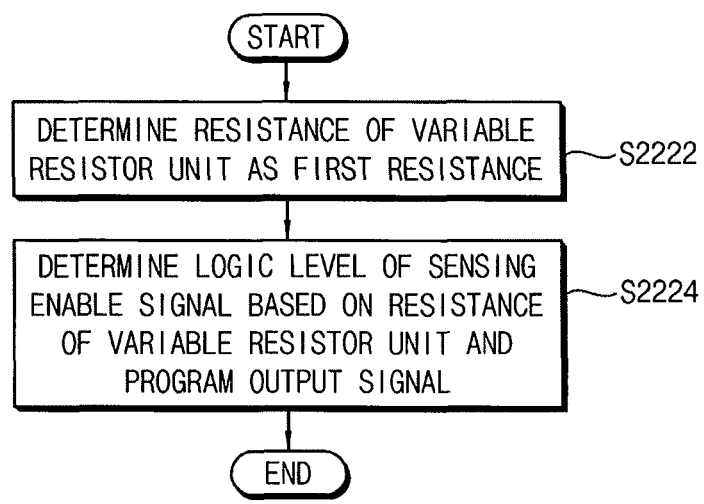
FIG. 9 illustrates a flow chart of an exemplary embodiment of a first sensing operation in FIG. 8.
Figure 10:
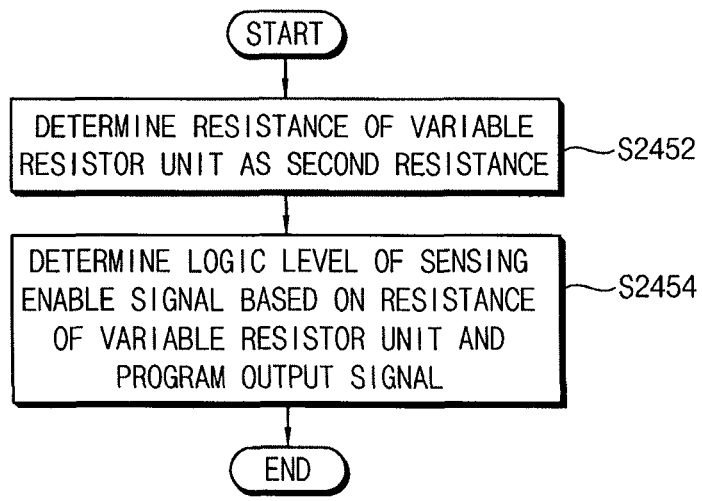
FIG. 10 illustrates a flow chart of an exemplary embodiment of a second sensing operation in FIG. 8.

FIG. 8 illustrates a flow chart of another exemplary embodiment of an operation of the fuse circuit 1000 of FIG. 1. FIG. 9 illustrates a flow chart of an exemplary embodiment of the first sensing operation in FIG. 8. FIG. 10 illustrates a flow chart of an exemplary embodiment of the second sensing operation in FIG. 8.

Hereinafter, another exemplary operation of the fuse circuit 1000 will be described with reference to FIGS. 1, 3, 8, 9, and 10.

Referring to FIG. 8, the fuse circuit 1000 of FIG. 1 may operate in a first operation mode (S210), a second operation mode (S240) and/or a third operation mode (S260). The first operation mode may include a first determination mode (S220) and a second determination mode (S230).

In the first operation mode, before determining whether or not a program operation is required, the fuse circuit 1000 may perform a defect determination operation. The fuse circuit 1000 may perform a first sensing operation based on a resistance of the variable resistor unit 1220 and the program output signal PS to generate a first sensing result (S222).

Referring to FIG. 9, in S222, the resistance of the variable resistor unit 1220 may be determined based on the control signal CON (S2222). For example, the resistance of the variable resistor unit 1220 may be determined as a first resistance in the first operation mode. The first resistance may be smaller than or equal to the resistance of the program unit 1100 before the program unit 1100 is programmed. For example, the first resistance may be equal to and/or about 400 kΩ. A logic level of the sensing output signal SOUT may be determined based on the resistance of the variable resistor unit 1220 (i.e., the first resistance) and the program output signal PS (S2224). The sensing output signal SOUT in the first operation mode may indicate whether or not a fuse included in the program unit 1100 is a defective fuse.

Referring back to FIG. 8, in the first operation mode, the fuse circuit 1000 may determine whether or not the program unit 1100 is defective based on the first sensing result (S224). For example, the control unit 1300 may determine whether or not the fuse included in the program unit 1100 is the defective fuse based on the sensing output signal SOUT. When the sensing output signal SOUT has a first logic level (e.g., a logic low level), the control unit 1300 may identify that the fuse included in the program unit 1100 is the defective fuse. When the sensing output signal SOUT has a second logic level (e.g., a logic high level), the control unit 1300 may identify that the fuse included in the program unit 1100 is a normal fuse.

If the program unit 1100 is defective, the program unit 1100 is disabled and operations of the fuse circuit 1000 are terminated. For example, the program unit 1100 may be disabled by masking or screening an output of the program unit 1100.

If the program unit 1100 is not defective (i.e., normal), the fuse circuit 1000 is ready to operate in the second determination mode. The fuse circuit 1000 may then determine whether or not the program operation is required (S232). If the program operation is not required, the program unit 1100 is unprogrammed, the second operation mode is omitted and the fuse circuit 1000 is ready to operate in the third operation mode. The fuse circuit 1000 may perform a normal operation in the third operation mode (S265). If the program operation is required, the fuse circuit 1000 performs the program operation (S234). The steps S232, S265 and S234 may be substantially the same as the steps S115, S155 and S120 in FIG. 6, respectively.

After the fuse circuit 1000 performs the program operation, in the second operation mode, the fuse circuit 1000 may verify the program operation. The fuse circuit 1000 may perform a second sensing operation based on the resistance of the variable resistor unit 1220 and the program output signal PS to generate a second sensing result (S245).

Referring to FIG. 10, in S245, the resistance of the variable resistor unit 1220 may be determined based on the control signal CON (S2452). For example, the resistance of the variable resistor unit 1220 may be determined as a second resistance in the second operation mode. The second resistance may be larger than or equal to the resistance of the program unit 1100 after the program unit 1100 is programmed. For example the second resistance may equal to and/or about 10 kΩ. The logic level of the sensing output signal SOUT may be determined based on the resistance of the variable resistor unit 1220 (i.e., the second resistance) and the program output signal PS (step S2454). The sensing output signal SOUT in the second operation mode may indicate whether or not the program unit 1100 is normally programmed.

Referring back to FIG. 8, in the second operation mode, the fuse circuit 1000 may determine whether or not a re-program operation is required based on the second sensing result (S250). If the re-program operation is required, the fuse circuit 1000 performs the re-program operation (S255). If the re-program operation is not required, the fuse circuit 1000 is ready to operate in the third operation mode. The fuse circuit 1000 may perform the normal operation in the third operation mode (S265). For example, the resistance of the variable resistor unit 1220 may be determined as a third resistance in the third operation mode. The third resistance may be smaller than the first resistance and larger than the second resistance. The third resistance may equal to and/or about 50 kΩ. The steps S250, S255 and S265 may be substantially the same as the steps S140, S145 and S155 in FIG. 6, respectively.

Figure 11:
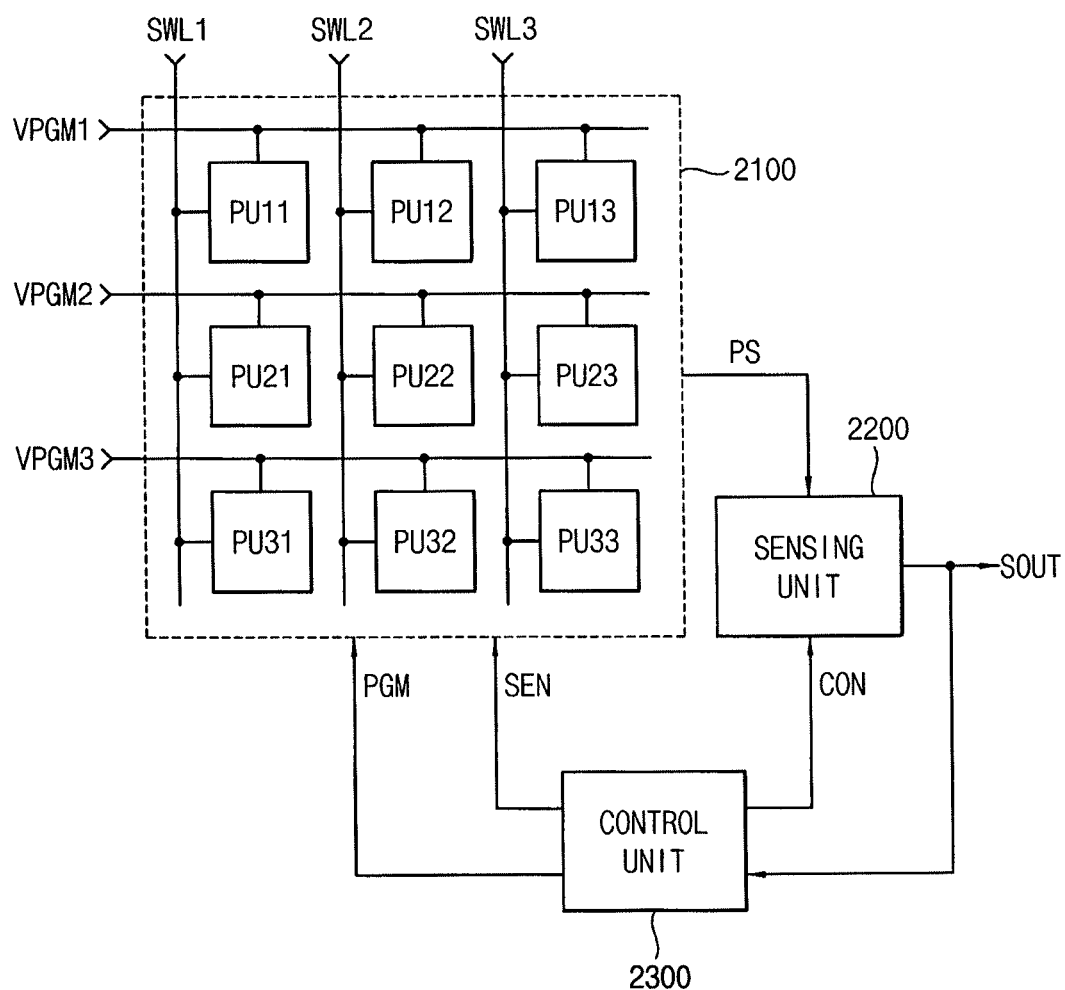
FIG. 11 illustrates a block diagram of an exemplary embodiment of a fuse array.

FIG. 11 illustrates a block diagram of an exemplary embodiment of a fuse array 2000.

Referring to FIG. 11, the fuse array 2000 may include the fuse array unit 2100 and a sensing unit 2200 and a control unit 2300.

The fuse array 2000 according to some example embodiments may operate alternatively in three modes, that is, a first operation mode (e.g., a program mode), a second operation mode (e.g., a sensing mode) or a third operation mode (e.g., a normal mode). The fuse array 2000 may perform a program operation in the first operation mode, performs a verification operation in the second operation mode, and performs a normal operation in the third operation mode. The fuse array 2000 may further perform a defect determination operation before the program operation in the first operation mode.

The fuse array unit 2100 may include a plurality of program units PU11, PU12, PU13, PU21, PU22, PU23, PU31, PU32, and PU33. The program units PU11, PU12, PU13, PU21, PU22, PU23, PU31, PU32 and PU33 may receive one of program voltages VPGM1, VPGM2, and VPGM3 and one of wordline signals SWL1, SWL2, and SWL3. Each of the program units PU11, PU12, PU13, PU21, PU22, PU23, PU31, PU32, and PU33 is programmed in response to the program signal PGM and outputs a program output signal PS in response to a sensing enable signal SEN. For example, the program unit PU11 may receive a first program voltage VPGM1 and a first wordline signal SWL1, may be programmed in response to the program signal PGM, and may output the program output signal PS in response to the sensing enable signal SEN.

The program signal PGM, the sensing enable signal SEN and the program output signal may be provided to or may be output from a selected program unit of the program units PU11, PU12, PU13, PU21, PU22, PU23, PU31, PU32, and PU33 in response to the program voltages VPGM1, VPGM2, and VPGM3 and the wordline signals SWL1, SWL2, and SWL3. For example, the first program unit PU11 may be enabled when the program voltage VPGM1 and the selection signal SWL1 are activated. The first program unit PU11 may receive the activated program signal PGM and may be programmed in the first operation mode. The first program unit PU11 may receive the activated sensing enable signal SEN and may output the program output signal PS for the verification operation in the second operation mode. The first program unit PU11 may further receive the activated sensing enable signal SEN and may further output the program output signal PS for the defect determination operation in the first operation mode.

In one or more embodiments, each of the program units PU11, PU12, PU13, PU21, PU22, PU23, PU31, PU32, and PU33 may have substantially the same structure as the program unit 1100 of FIG. 2.

In one or more embodiments, the program units PU11, PU12, PU13, PU21, PU22, PU23, PU31, PU32, and PU33 are arranged in a matrix configuration including a plurality of rows and a plurality of columns. Although the fuse array unit 2100 including nine program units PU11, PU12, PU13, PU21, PU22, PU23, PU31, PU32 and PU33 in 3*3 matrix configurations is illustrated in FIG. 11, the number of program units included in the fuse array unit 2100 is not limited thereto.

The sensing unit 2200 may include a variable resistor unit that has a resistance varied based on a control signal CON. The sensing unit 2200 may generate a sensing output signal SOUT based on the resistance of the variable resistor unit and the program output signal PS which is output from the selected program unit. The sensing unit 2200 may have substantially the same structure as the sensing unit 1200 of FIG. 3.

The control unit 2300 may generate the control signal CON having a value changed depending on the operation modes. The control unit 2300 performs the verification operation with respect to the selected program unit based on the sensing output signal SOUT to generate a verification result. The selected program unit may be re-programmed based on the verification result. The control unit 2300 may further perform the defect determination operation with respect to the selected program unit based on the sensing output signal SOUT to generate a defect determination result. The selected program unit may be disabled based on the defect determination result.

In one or more embodiments, the fuse array 2000 may determine whether or not the program operation is required with respect to all of the program units PU11, PU12, PU13, PU21, PU22, PU23, PU31, PU32, and PU33, may perform the program operation and the verification operation with respect to the program units that are required to be programmed, and then may perform the normal operation.

Although the fuse array 2000 includes the program units PU11, PU12, PU13, PU21, PU22, PU23, PU31, PU32, and PU33, individual programming operation and sensing operation may be performed on each of the program units PU11, PU12, PU13, PU21, PU22, PU23, PU31, PU32, and PU33, based on the program voltages VPGM1, VPGM2, and VPGM3 and the wordline signals SWL1, SWL2, and SWL3. That is, the fuse array 2000 may include a single sensing unit and a single control unit without regard to the number of program units, and, thus, the integration degree of the fuse array 2000 may be enhanced.

In one or more embodiments of the fuse array 2000, the sensing unit 2200 may include the variable resistor unit that has the resistance varied based on the control signal CON. Thus, the sensing unit 2200 may effectively control the sensing operations by varying the resistance of the variable resistor unit. Furthermore, the fuse array 2000 may verify whether or not the selected program unit is normally programmed and/or may determine whether or not the fuse included in the selected program unit is the defective fuse based on the sensing output signal SOUT that is generated based on the varied resistance of the variable resistor unit, thereby having the improved reliability.

Figure 12:
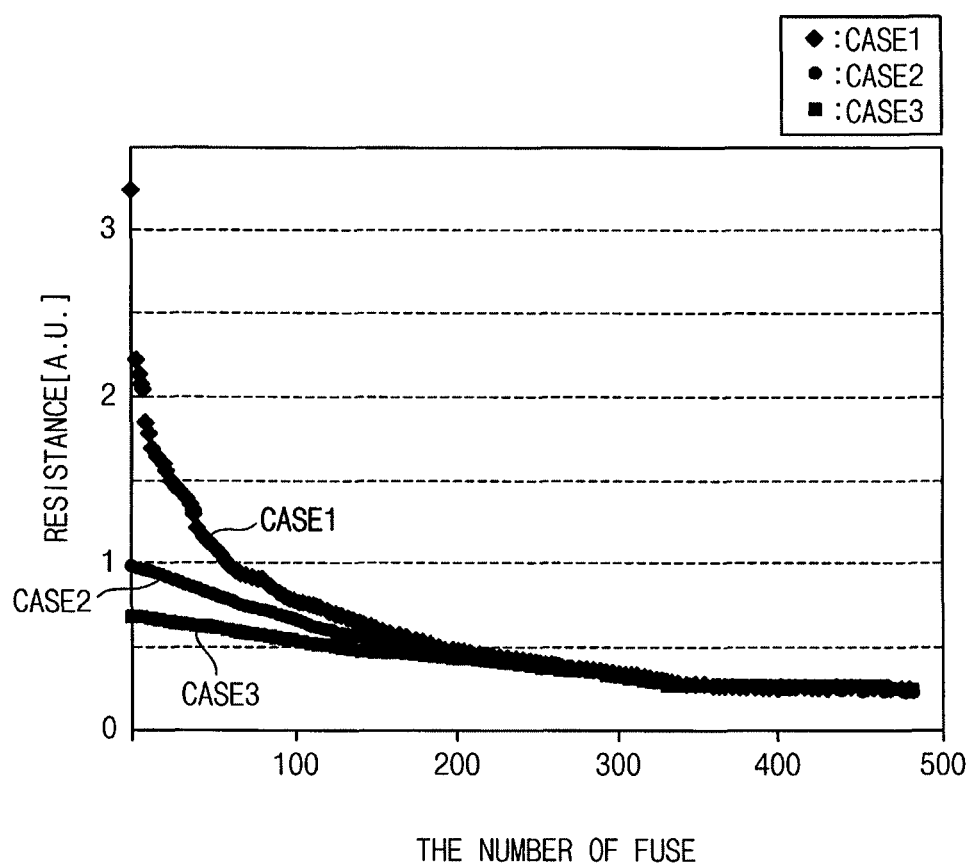
FIG. 12 illustrates a diagram for describing performance of the fuse array of FIG. 11.

FIG. 12 illustrates a diagram for describing performance of the fuse array of FIG. 11. FIG. 12 illustrates resistances of the program units in the fuse array 2000 of FIG. 11, according to the number of times the program units are programmed.

In FIG. 12, CASE1 indicates a case in which all of the program units are programmed once. CASE2 indicates a case in which abnormally programmed units are re-programmed once. CASE3 indicates a case in which the abnormally programmed units are re-programmed twice.

Referring to FIG. 12, a first difference between a maximum resistance and a minimum resistance in CASE1 is about 3.0, a second difference between a maximum resistance and a minimum resistance in CASE2 is about 0.75, and a third difference between the maximum resistance and the minimum resistance in CASE3 is about 0.42. The second difference is reduced by about 75% with respect to the first difference and the third difference is reduced by about 86% with respect to the first difference. Thus, when the re-program operation is performed, the program units may have relatively uniform resistances, the difference between the maximum resistance and the minimum resistance may be reduced, and thus the fuse array 2000 of FIG. 11 may have an improved program performance.

Figure 13:
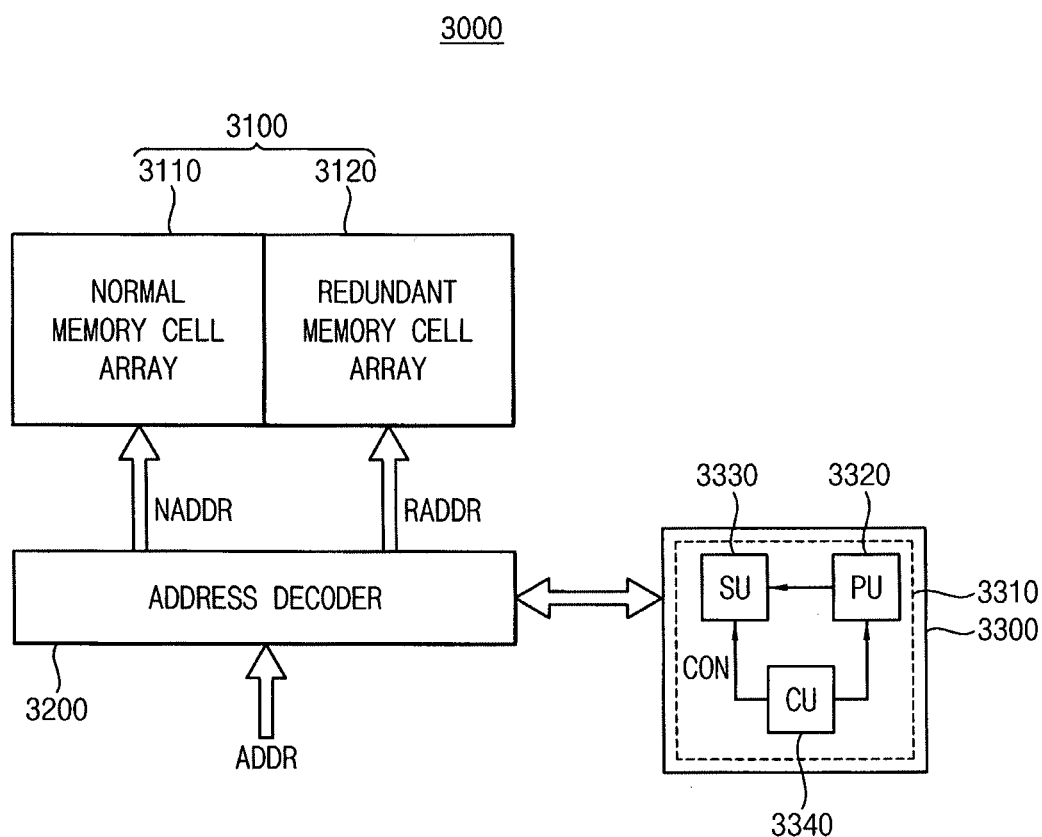
FIG. 13 illustrates a block diagram of an exemplary embodiment of a semiconductor memory device.

FIG. 13 illustrates a block diagram of an exemplary embodiment of a semiconductor memory device 3000.

Referring to FIG. 13, the semiconductor memory device 3000 may include a memory cell array 3100, an address decoder 3200, and a repair circuit 3300.

The memory cell array 3100 may include a normal memory cell array 3110 and a redundant memory cell array 3120. The normal memory cell array 3110 includes a plurality of normal memory cells and the redundant memory cell array 3120 may include a plurality of redundant memory cells. The redundant memory cell array 3120 may include a plurality of memory blocks scattered in memory cell array 3100.

Fuse circuits in the repair circuit 3300 may be programmed when normal memory cells have defects and the repair circuit 3300 may output a sensing output signal indicating whether or not the program units included in the fuse circuits are programmed. The address decoder 3200 may selectively output a normal address signal NADDR or a redundant address signal RADDR in response to a address signal ADDR and the sensing output signal to thereby access the normal memory cells or the redundant memory cells. The address decoder 3200 may be a row decoder to select a wordline or may be a column decoder to select a bitline or may include both the row and column decoders. The repair circuit 3300 may have configuration to repair the defective memory cell in a row unit or in a column unit.

The repair circuit 3300 may include a plurality of fuse circuits. As described with reference to FIG. 1, each fuse circuit 3310 may include a program unit 3320, a sensing unit 3330 and a control unit 3340. The program unit 3320 may be programmed in response to a program signal and may output a program output signal in response to a sensing enable signal. The sensing unit 3330 may include a variable resistor unit having a resistance varied based on a control signal CON, and may generate the sensing output signal based on the resistance of the variable resistor unit and the program output signal. The control unit 3340 may generate the control signal CON having a value changed depending on operation modes, and may perform a verification operation with respect to the program unit based on the sensing output signal to generate a verification result. The program unit 3320 may be re-programmed based on the verification result.

In one or more embodiments, the repair circuit 3300 may be implemented with the fuse array 2000 of FIG. 11. The fuse array may include a fuse array unit, a sensing unit, and a control unit. The fuse array unit may include a plurality of program units. The sensing unit may include a variable resistor unit having a resistance varied based on a control signal. The control unit may generate the control signal having a value changed depending on operation modes, and may performs a verification operation with respect to the selected program unit to generate a verification result. The selected program unit is re-programmed based on the verification result.

If even a single memory cell within a semiconductor memory device functions improperly, the semiconductor memory device may be considered to be defective. However, if a relatively small number of memory cells are malfunctioning, it may not be efficient to treat the entire semiconductor memory device as being defective. Therefore, one or more redundancy memory cells may be included within the semiconductor memory device so that the redundancy memory cells may functionally replace defective memory cells within the semiconductor memory device. Accordingly, the semiconductor memory device, by replacing the defective memory cell with the redundancy memory cells, may be treated as a non-defective or normal semiconductor memory device, thereby increasing a yield of semiconductor memory devices. A repairing process using the redundancy memory cells may include replacing the defective memory cell with the redundancy memory cell by switching corresponding addresses. For example, if the defective memory cell is detected by a test after wafer processing, a corresponding address of the defective memory cell may be switched to an address of the redundancy memory cell. Therefore, an address of the defective memory cell may be mapped to an address of the redundancy memory cell instead. Fuse circuits may be used to perform the above-mentioned repairing process. If the reliability of the fuse circuit is low, possibility of malfunction of the semiconductor memory device is high. Therefore, performance of the semiconductor memory device may be enhanced by using the fuse circuits having improved reliability.

One or more embodiments employing one or more features described herein may be applied to arbitrary devices requiring the fuse circuit, such as the semiconductor memory device. For example, the above described embodiments may be adopted in a dynamic random access memory (DRAM), a synchronous DRAM (SDRAM), a non-volatile memory, etc. One or more embodiments employing one or more features described herein may be further adopted in a memory system and an electronic system including the semiconductor memory device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A fuse circuit in a semiconductor memory device, comprising:
a program unit configured to be programmed in response to a program signal and configured to output a program output signal in response to a sensing enable signal;
a sensing unit including a variable resistor unit, the variable resistor unit having a resistance that varies based on a control signal, the sensing unit generating a sensing output signal based on the resistance of the variable resistor unit and the program output signal; and
a control unit configured to generate the control signal having a value changed depending on operation modes and configured to perform a verification operation with respect to the program unit based on the sensing output signal to generate a verification result for determining whether the program unit is to be re-programmed, the operation modes including a first operation mode, a second operation mode and a third operation mode, the fuse circuit performing a program operation in the first operation mode, the fuse circuit verifying the program operation in the second operation mode, and the fuse circuit performing a normal operation according to programmed or unprogrammed state of the program unit.

2. The fuse circuit as claimed in claim 1, wherein the sensing unit performs a sensing operation in the second operation mode based on the resistance of the variable resistor unit to generate a sensing result, and the control unit performs the verification operation based on the sensing result in the second operation mode to determine whether or not the program unit is normally programmed.

3. The fuse circuit as claimed in claim 2, wherein the sensing unit determines the resistance of the variable resistor unit based on the control signal and determines a logic level of the sensing output signal based on the resistance of the variable resistor unit and the program output signal in the second operation mode, the sensing output signal in the second operation mode indicating whether or not the program unit is normally programmed.

4. The fuse circuit as claimed in claim 3, wherein the control unit performs the verification operation based on the logic level of the sensing output signal in the second operation mode to determine whether or not the program unit is normally programmed, and
wherein the program unit is re-programmed when the program unit is abnormally programmed.

5. The fuse circuit as claimed in claim 1, wherein the resistance of the variable resistor unit is determined as a first resistance in the second operation mode, and as a second resistance in the third operation mode, the second resistance being larger than the first resistance.

6. The fuse circuit as claimed in claim 1, wherein the control unit further performs a defect determination operation with respect to the program unit based on the sensing output signal to generate a defect determination result, the program unit being disabled based on the defect determination result.

7. The fuse circuit as claimed in claim 6, wherein the sensing unit performs a sensing operation in the first operation mode based on the resistance of the variable resistor unit to generate a sensing result, and the control unit performs the defect determination operation based on the sensing result in the first operation mode to determine whether or not a fuse included in the program unit is a defective fuse.

8. The fuse circuit as claimed in claim 7, wherein the sensing unit determines the resistance of the variable resistor unit based on the control signal and determines a logic level of the sensing output signal based on the resistance of the variable resistor unit and the program output signal in the first operation mode, the sensing output signal in the first operation mode indicating whether or not the fuse included in the program unit is the defective fuse.

9. The fuse circuit as claimed in claim 8, wherein the control unit performs the defect determination operation based on the logic level of the sensing output signal in the first operation mode to determine whether or not the fuse included in the program unit is the defective fuse, and
wherein the program unit is disabled when the fuse included in the program unit is the defective fuse.

10. The fuse circuit as claimed in claim 6, wherein the resistance of the variable resistor unit is determined as a first resistance in the second operation mode, as a second resistance in the third operation mode, and as a third resistance in the first operation mode, the second resistance being larger than the first resistance, and the third resistance being larger than the second resistance.

11. The fuse circuit as claimed in claim 1, wherein the sensing unit includes:
the variable resistor unit having the resistance varied based on the control signal; and
a sensing output signal generation unit configured to generate the sensing output signal based on the resistance of the variable resistor unit and the program output signal.

12. The fuse circuit as claimed in claim 11, wherein the variable resistor unit includes:
a plurality of metal oxide semiconductor (MOS) transistors connected in serial between the sensing output signal generation unit and a ground voltage, each of the MOS transistors having a gate electrode receiving a gate control signal, a voltage level of the gate control signal being fixed; and
a switch unit configured to control electrical connections of the plurality of MOS transistors based on the control signal.

13. The fuse circuit as claimed in claim 11, wherein the variable resistor unit includes:
a MOS transistor connected between the sensing output signal generation unit and a ground voltage, the MOS transistor having a gate electrode receiving the control signal.

14. A semiconductor memory device, comprising:
a memory cell array including normal memory cells and redundant memory cells;
an address decoder configured to access the normal memory cells or the redundant memory cells in response to an address signal and a sensing output signal; and
a repair circuit configured to be programmed to indicate the normal memory cell corresponding to the address signal is a defective cell and configured to output the sensing output signal, the repair circuit including a plurality of fuse circuits, each fuse circuit comprising:
a program unit configured to be programmed in response to a program signal and configured to output a program output signal in response to a sensing enable signal;
a sensing unit including a variable resistor unit, the variable resistor unit having a resistance that varies based on a control signal, the sensing unit generating the sensing output signal based on the resistance of the variable resistor unit and the program output signal; and
a control unit configured to generate the control signal having a value changed depending on operation modes and configured to perform a verification operation with respect to the program unit based on the sensing output signal to generate a verification result for determining whether the program unit is to be re-programmed, the operation modes including a first operation mode, a second operation mode and a third operation mode, the fuse circuit performing the program operation in the first operation mode, a fuse circuit verifying a program operation in the second operation mode, and the fuse circuit performing a normal operation according to programmed or unprogrammed state of the program unit.

15. A fuse circuit included in a semiconductor memory device and configured to operate in a plurality of operation modes including a first operation mode, a second operation mode and a third operation mode, the fuse circuit comprising:
a program unit including at least one fuse, the program unit being configured to be programmed in response to a program signal and configured to output a program output signal in response to a sensing enable signal;
a sensing unit including a variable resistor unit, the variable resistor unit having a resistance that varies based on a control signal, the sensing unit generating a sensing output signal based on the resistance of the variable resistor unit and the program output signal; and
a control unit configured to generate the control signal having a value based a current operation mode and configured to perform a verification operation with respect to the program unit based on the sensing output signal to generate a verification result,
wherein when the verification result indicates a defect in the programming of the program unit, the program unit is re-programmed.

16. The fuse circuit as claimed in claim 15, wherein the sensing output signal indicates whether the fuse is defective or normal.

17. The fuse circuit as claimed in claim 16, wherein when the fuse is determined to be defective all operations of the fuse circuit are terminated.

18. The fuse circuit as claimed in claim 15, wherein the first operation mode is a programming mode for programming the program unit, the second operation mode is a verification mode for verifying the programming of the program unit, and the third operation mode is a normal operation mode, wherein the normal operation mode is performed only after the program unit is determined to not require programming and/or, if the program unit was programmed, that the programming of the program unit was verified during the second operation mode.

* * * * *